US005476738A

United States Patent [19]
Yuan

[11] Patent Number: 5,476,738
[45] Date of Patent: Dec. 19, 1995

[54] PHOTOLITHOGRAPHIC DOSE DETERMINATION BY DIFFRACTION OF LATENT IMAGE GRATING

[75] Inventor: Chi-Min Yuan, Austin, Tex.

[73] Assignee: International Business Machines Corporation, Armonk, N.Y.

[21] Appl. No.: 241,546

[22] Filed: May 12, 1994

[51] Int. Cl.$^6$ ...................................................... G03F 7/20
[52] U.S. Cl. .......................... 430/30; 430/311; 430/396; 250/491.1
[58] Field of Search .............................. 430/30, 311, 394, 430/396, 397; 250/491.1

[56] References Cited

U.S. PATENT DOCUMENTS

| | | | |
|---|---|---|---|
| 4,308,586 | 12/1981 | Coates | 364/525 |
| 4,640,619 | 2/1987 | Edmark, III | 356/372 |
| 4,670,650 | 6/1987 | Matsuzawa et al. | 250/307 |
| 4,890,239 | 12/1989 | Ausschnitt et al. | 364/491 |
| 4,982,226 | 1/1991 | Takahashi | 355/53 |
| 5,124,927 | 6/1992 | Hopewell | 364/468 |

FOREIGN PATENT DOCUMENTS

| | | | |
|---|---|---|---|
| 0502679A1 | 9/1992 | European Pat. Off. | G03B 41/00 |
| WO9215923 | 9/1992 | WIPO | G03F 7/20 |

OTHER PUBLICATIONS

Wittekoek, S.; Van Der Werf, J.; and George, R. A.; "Phase Gratings as Wafer-stepper Alignment Marks for all Process Layers", *Optical Microlithography, SPIE* vol. 538 (1985), pp. 24–31.

Yamashita, K., Nomura, N., Kubow, K, Yamada, Y. and Suzuki, M., "Heterodyne Holographic Nanometer Alignment for a Half-Micron Wafer Stepper", *Optical/Laser Microlithography III, SPIE* vol. 1264 (1990), pp. 219–226.

Hickman, K. C., Gaspar, S. M., Bishop, K. P., Naqvi, S. S. H., McNeil, J. R., Tipton, G. D., Stallard, Draper, B. R., Draper, B. L., "Use of Diffracted Light from Latent Images to Improve Lithography Control", *Integrated Circuit Metrology, Inspection, and Process Control V, SPIE* vol. 1464 (1991), pp. 245–257.

Adams, Thomas E., "Applications of Latent Image Metrology in Microlithography", *Integrated Circuit Metrology, Inspection, and Process Control V, SPIE*, vol. 1464 (1991), pp. 294–312.

Ota, Kazuya; Magome, Nobutaka; and Nishi, Kenji; "New Alignment Sensors for Wafer Stepper" *Optical/Laser Microlithography IV SPIE*, vol. 1463 (1991), pp. 304–314.

Katagiri, Souichi; Moriyama, Shigeo; and Terasawa, Tsuneo; "Alignment Technique Using Wafer Rear Surface", *Optical/Laser Microlithography V SPIE*, vol. 1674 (1992) pp. 509–516.

Bayer, T. and Makosch, G. "Photolithographic Process Control by Optical Phase Monitoring of Latent Images in Photoresist", *IBM Technical Disclosure Bulletin* vol. 34 No. 10A Mar. 1992.

Korth, H. E., "Method of Directly Measuring Line Width Deviations", *IBM Techical Disclosure Bulletin* vol. 34, No. 2, Jul. 1991.

*Primary Examiner*—Kathleen Duda
*Attorney, Agent, or Firm*—Whitham, Curtis, Whitham & McGinn; Harold Huberfeld

[57] ABSTRACT

A method of determining quantitatively the exposure levels for photoresists in semiconductor photolithography employs a specially designed grating pattern on a mask. The mask is first used to expose a series of LIM image gratings of different dosages. Then a normal plane wave at a longer wavelength is incident on these gratings one by one, and some nonzero order diffraction efficiency of the grating is measured to determine quantitatively the correct dosage to be used. This method can make a determination of exposure dosage, without knowledge of underlying film thickness and refractive index, and handle either resist thickness change or underlying film thickness/refractive index change or both.

4 Claims, 7 Drawing Sheets

PHOTOLITHOGRAPHIC DOSE DETERMINATION BY DIFFRACTION OF LATENT IMAGE GRATING

DESCRIPTION

BACKGROUND OF THE INVENTION

1. Field of the Invention

The present invention generally relates to photolithiographic processes in the manufacture of semiconductor devices and, more particularly, to using a latent image grating to determine quantitatively the exposure dosage required in semiconductor photolithography for optimum processing.

2. Description of the Prior Art

In photolithographic processes, the photoresist line-width variation typically needs to be controlled within 10% of its nominal value. Very often this cannot be achieved due to the interference effect which causes the energy absorbed by the photoresist to fluctuate. The interference effect is caused by the thickness variation of the photoresist itself, the thickness variation of underlying film(s), and the optical property change of the underlying film(s), e.g., due to hot processes. This problem is aggravated when the exposure sources use short wavelengths, i.e., i-line and deep ultra-violet (DUV) wavelengths. Small thickness changes can correspondingly result in large variations in absorbed energy.

Several methods have been used in the past to address the problem, among which are a "send ahead" wafer for each job. In this method, a series of dosages are used on each wafer, the wafer is developed and the line-widths corresponding to various dosages are measured to determine the optimum dosage. This method is accurate but time consuming and expensive.

A similar method was proposed by O. D. Crisalle, R. A. Soper, D. A. Mellichamp, and D. E. Seborg in "Adaptive control of photolithiography", *SPIE*, vol. 1464, pp. 508–526 (1991), with the same drawbacks. The problem can be eliminated with the addition of a top or bottom anti-reflective layer. This solution, however, adds an extra processing step and the material used makes the process more expensive.

J. A. Bruce, R. K. Leidy, M. S. Hibbs, and B. J. Lin in "Characterization and prediction of line-width variation due to thin film interference effects", *Proceedings KTI Microelectronics Seminar*, pp. 1–13 (1989), describe a process in which the reflectivity from the wafer surface can be measured and used to determine qualitatively if a higher or lower dosage needs to be used for that wafer or job. However, this method is effective when only one film thickness is varying. Otherwise, an infinite number of thickness combinations corresponding to different absorbed energies can result in the same reflectivity, in which case it cannot be used to determine the dosage.

Diffraction efficiencies of latent image (LIM) grating can be measured and used in conjunction with a rigorous Maxwell's equations' solver to determine the exposure dosage, as described by K. C. Hickman, S. M. Gaspar, K. P. Bishop, S. S. H. Naqvi, and J. R. McNeil in "Use of diffracted light from latent images to improve lithography control", *SPIE*, vol. 1464, pp. 245–257 (1991). However, one needs to know ahead of time the cause (e.g., which film thickness is varying) of the line-width variation and the optical indices of all relevant materials, so that the solver can perform the calculation. Neither of the two requirements can be easily achieved in production.

Nomarski differential interference contrast (NDIC) microscopy can be used to measure LIM to determine the exposure dosage. Commercially available NDIC microscopes can be modified to perform this task. In-situ, real time dosage adjustment can be done by incorporating such hardware into a stepper.

SUMMARY OF THE INVENTION

It is therefore an object of the present invention to provide a method of determining quantitatively the exposure dosage required in semiconductor photolithography which solves line-width variation problems due to thin film interference effect by dosage adjustment.

According to the invention, a specially designed grating pattern on the mask is first used to expose, at the exposure wavelength (e.g., 365 nm), a series of LIM image gratings of different dosages. Then a normal plane wave at a longer wavelength (e.g., 633 nm) is incident on these gratings one by one, and some nonzero order diffraction efficiency of the grating is measured to determine quantitatively the correct dosage to be used.

This invention can make a determination of exposure dosage, without knowledge of underlying film thickness and refractive index, and handle either resist thickness change or underlying film thickness/refractive index change or both.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
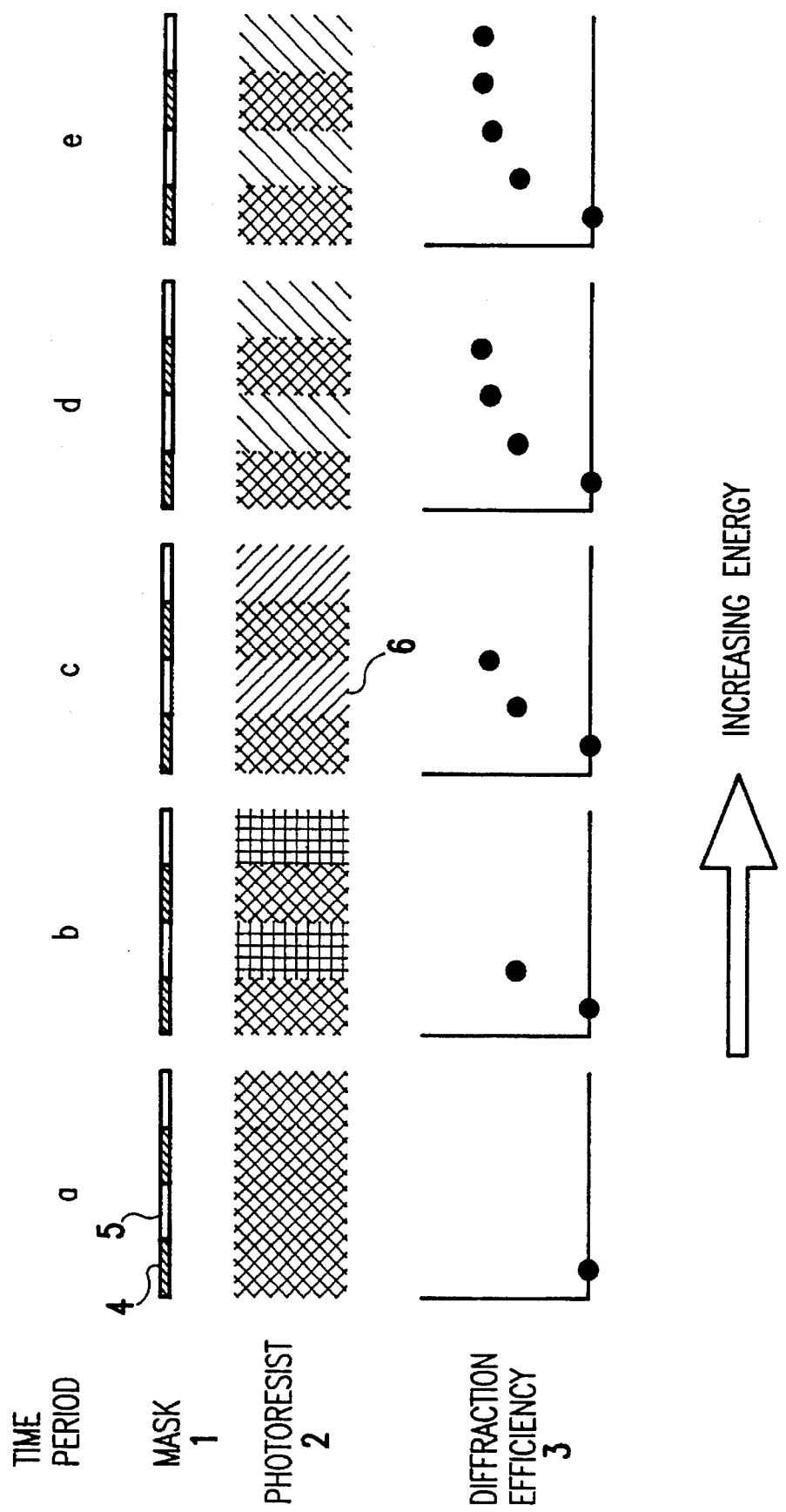
FIG. 1A illustrates the diffraction efficiency of latent image grating exposed by a conventional mask.

Referring now to the drawings, and more particularly to FIG. 1A, there is shown a conventional grating pattern on the mask 1 containing opaque lines and transparent spaces. The mask 1 is placed over a photoresist 2. A graph 3 is illustrated below the photoresist 2 to show the measured diffraction efficiency as energy increases. In FIG. 1A the mask 1, photoresist 2 and graph 3 are shown at five time periods denoted a to e during exposure. Before exposure, the non-zero order diffraction efficiency measured by graph 3 is zero. Opaque regions 4 in mask 1 prevent part of the photoresist 2 from having any exposure to light. Areas 6 of the photoresist 2 below the transparent regions 5 of mask 1 become bleached as energy increases. As the exposure dosage increases, the measured efficiency increases and eventually saturates when the resist bleaching process is completed and its change of optical property stops.

Figure 1B:
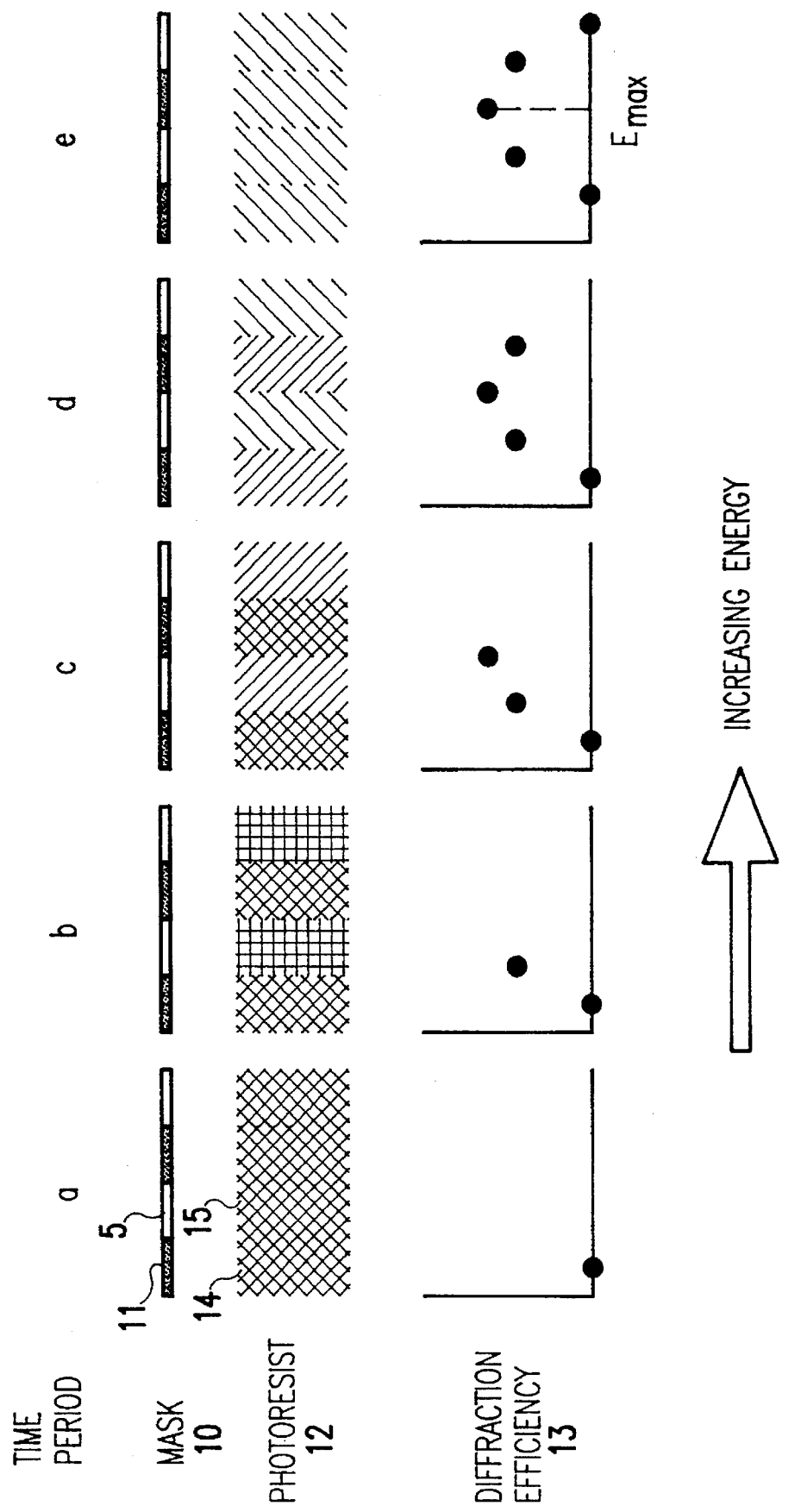
FIG. 1B illustrates the diffraction efficiency of latent image grating exposed by a dose mask according to the invention.

As can be seen from FIG. 1B, the mask 10 is not opaque, but allows some light transmission. Transparent regions 5 in mask 10 remain clear, but semitransparent regions 11, which replace opaque regions 4 in FIG. 1A, allow some light transmission. The invention uses a grating pattern so that what had been opaque lines become partially transparent (e.g., slightly greater than 0% to 70% of light transmission). As energy increases, the photoresist 12 eventually becomes fully bleached at time period e. The areas 14 of photoresist 12 below the semitransparent regions 11 bleach at a slower rate than areas 15 below the transparent regions 5 of the mask 10. Then at very large dosage, the diffraction efficiency is zero since the LIM grating is completely bleached. This effect allows clear reading of $E_{max}$ on the graph 13. In FIG. 1A, there is not a distinct quantity such as $E_{max}$ to characterize the exposure state of the resist.

The diffraction efficiency reaches the maximum when the "optical distinction" of the two LIM regions is maximized, and the corresponding dosage is called $E_{max}$. Notice the $E_{max}$ is not equal to imaging dosage, $D_{image}$ (i.e., dose to nominal CD). $E_{max}$ and $E'_{max}$ are measured quantities to determine what the new $D_{image}$ should be. If for a subsequent wafer/job the absorbed energy is reduced by a factor of $\alpha$ due to thin film interference effect, then $E_{max}$ measured will be increased by the same factor $\alpha$ since a higher dosage is required for the LIM grating to reach the same state of maximum optical distinction. Thus, $D_{image}$ can be adjusted by the same factor to compensate for the interference effect.

Figure 2:
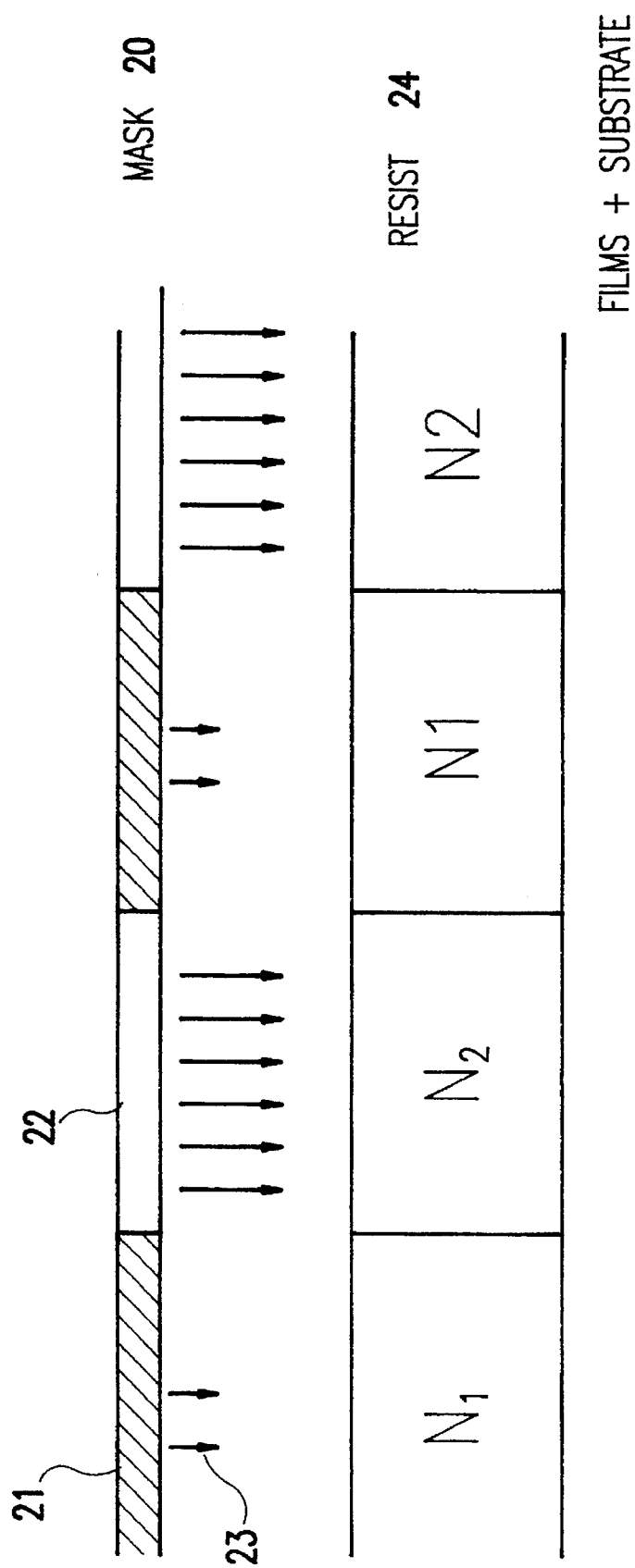
FIG. 2 illustrates the latent image model used in simulations.
Figure 3:
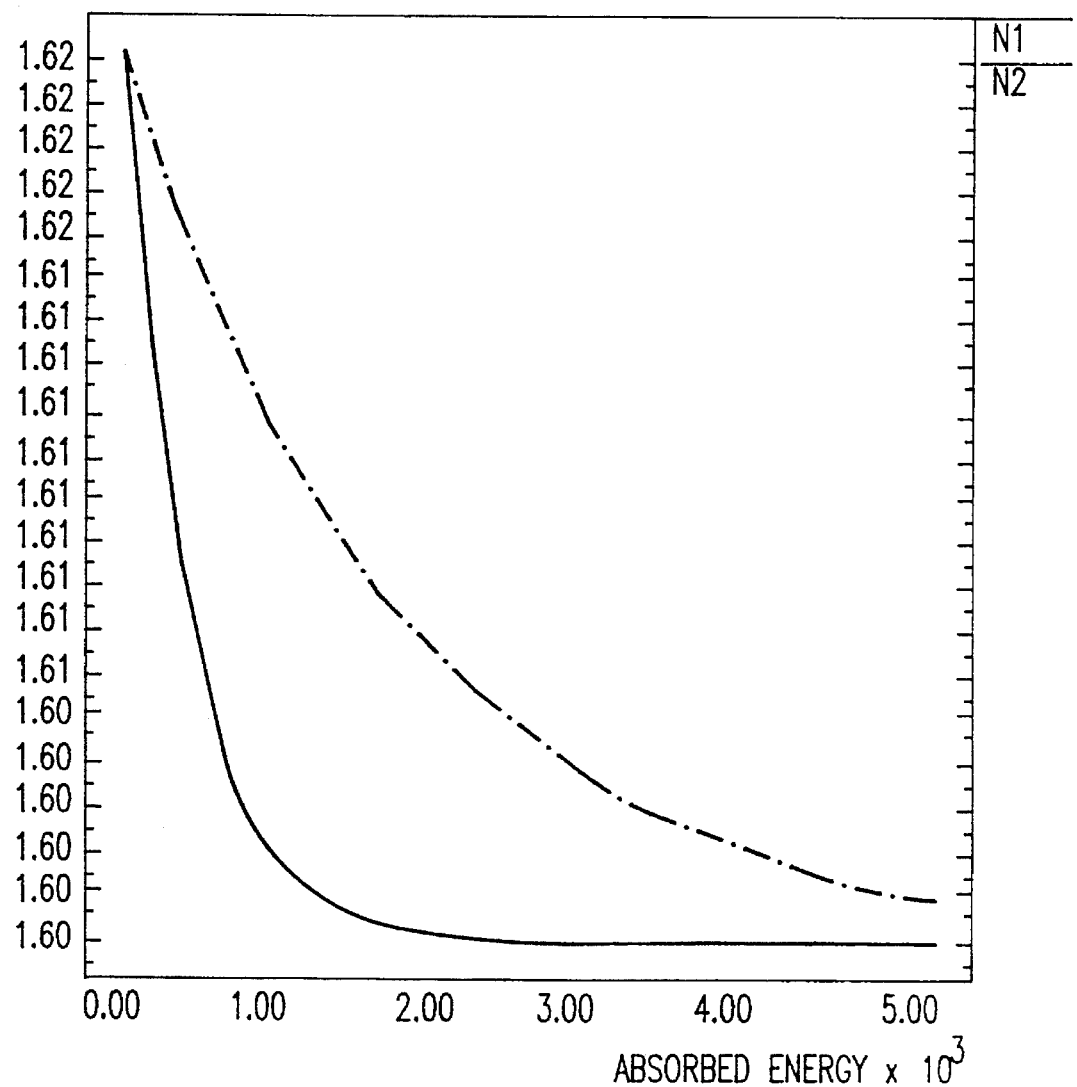
FIG. 3 is a graph showing the typical index change versus exposure energy absorbed by the resist.
Figure 4:
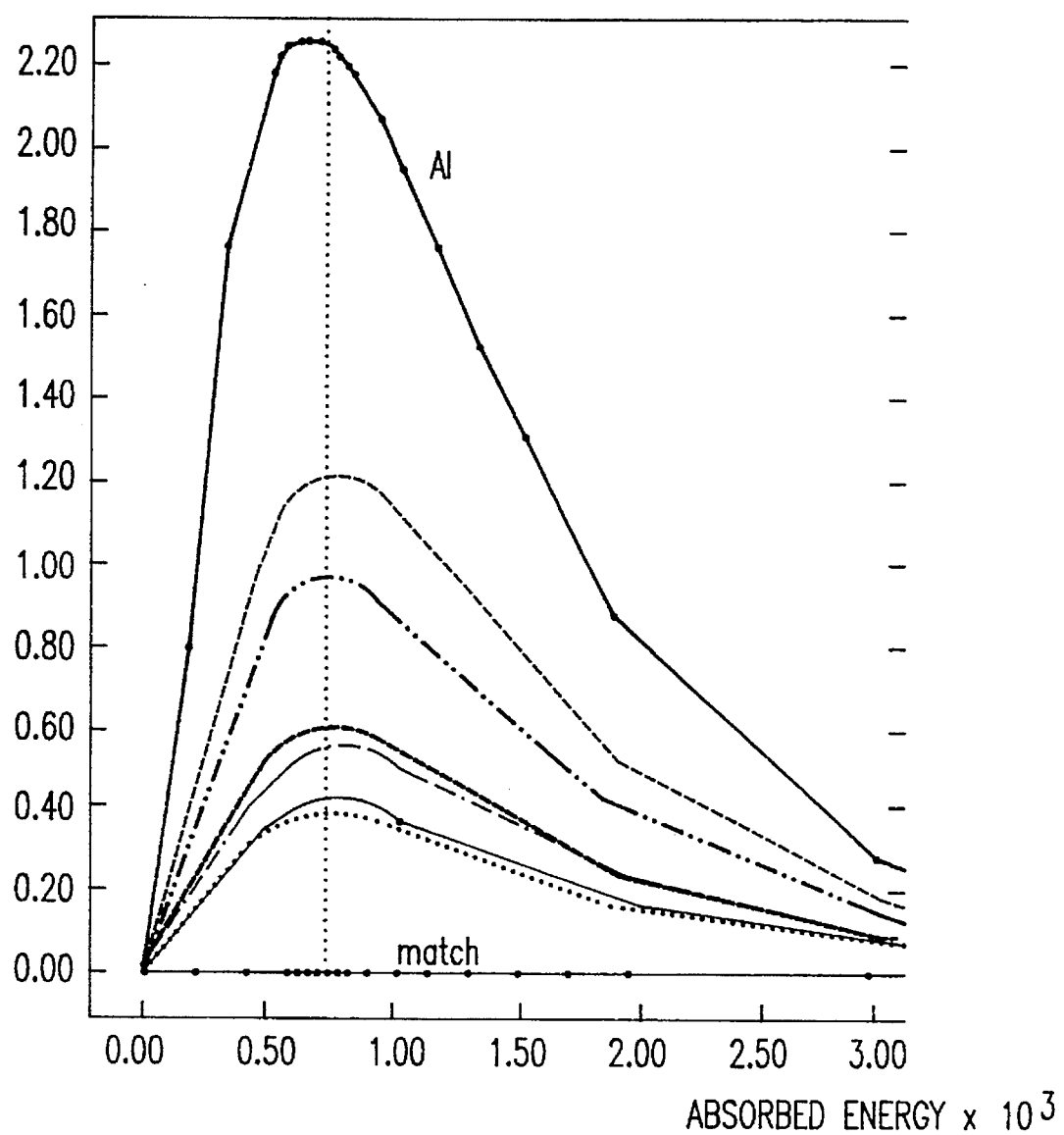
FIG. 4 is a graph showing the simulated first order diffraction efficiency from various combinations of films.

This invention has an important feature in that it is transparent to the source of the interference effect. This is illustrated in FIGS. 2, 3 and 4 in which the grating dimension and diffraction efficiency detection used are compatible, but not limited, to the ASML stepper's alignment system. Partial transmission (e.g., 25%) of energy 23 is assumed in FIG. 2 through semitransparent regions 21 of mask 20 above the photoresist 24, so the index (i.e., N1) change in the partial transmission region is four times slower than that (i.e., N2) in the transparent regions 22. FIG. 3 shows the hypothetical index change versus exposure energy absorbed by the resist, and FIG. 4 shows the simulated first-order diffraction efficiency from various combinations of films. A wide range of combinations of film and thickness were used and Maxwell's equations were solved numerically using the wave-guide model to calculate the data graphed in FIG. 4. The films are 1.04 μm resist on Aluminum (efficiency shown has been divided by 2 to fit in FIG. 4), resist of 0.96 μm, 1.00 μm, 1.04 μm, 1.08 μm on silicon, 1.04 μm resist on oxide (of 0.10 μm, 0.14 μm, 0.18 μm) on silicon, and 1.04 μm resist on matched substrate.

Peaks of all curves in the graph of FIG. 4 fall on the same line except for the aluminum substrate which is highly reflective. Therefore, wafers may need to be divided into two groups (i.e., of metallic substrates and dielectric substrates) and apply the invention to them separately. This can be done in production easily since wafers of metallic substrates are obvious to detect. Also, diffraction efficiency of a matched substrate may suffer from a weak signal level. However, substrates with low reflectivity usually do not suffer from the interference effect. Substrates of typical dielectric materials yield sufficient diffraction efficiency for detection. See, for example, K. C. Hickman et al., supra, and T. E. Adams, "Applications of latent image metrology in microlithiography", *SPIE*, vol. 1464, pp. 294–312 (1991).

Figure 5:
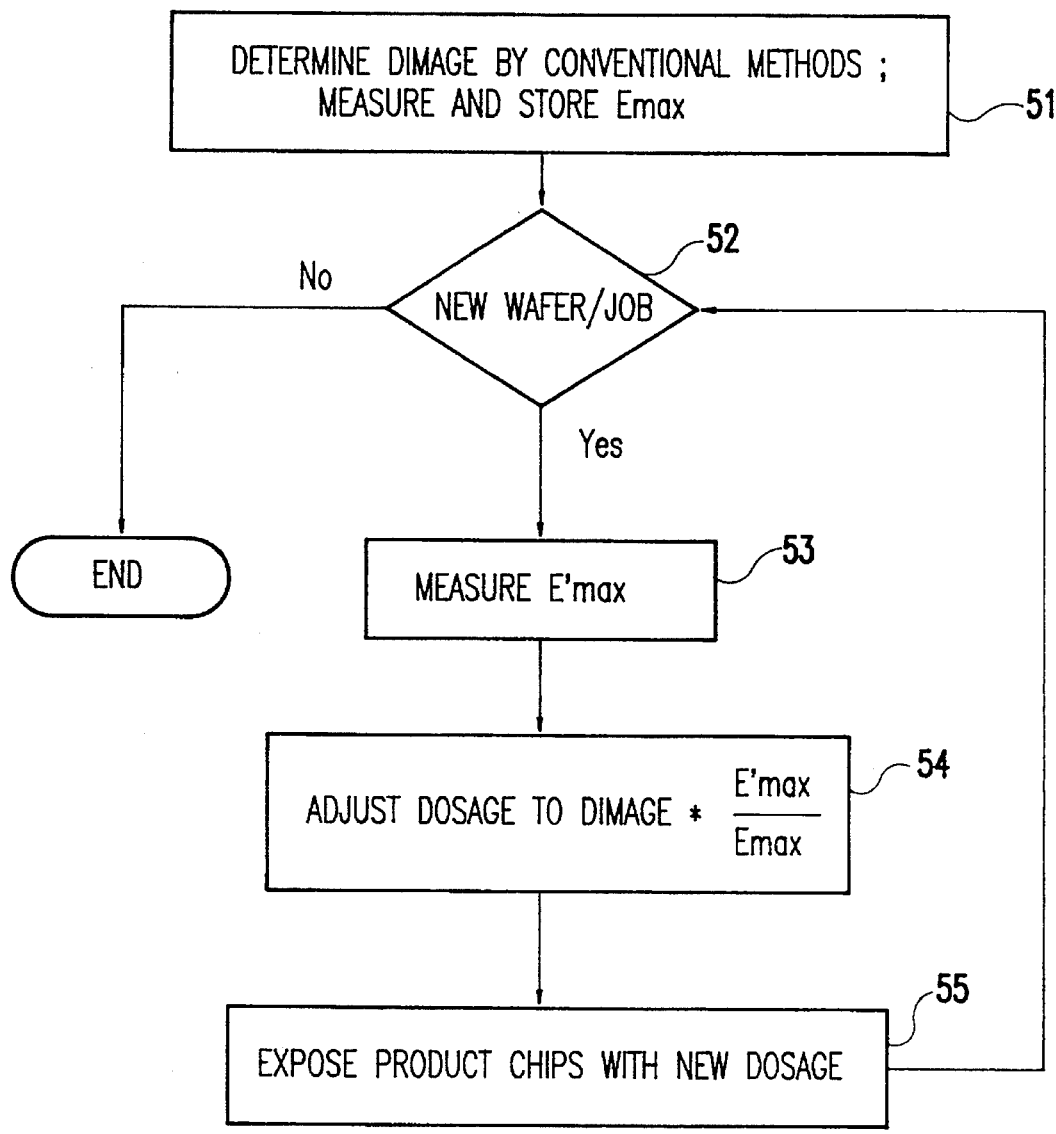
FIG. 5 is a flow chart illustrating the steps of implementing the invention.

Implementation of a preferred embodiment of the present invention is illustrated in the flow chart of FIG. 5, in which the frequency of updating the dosage depends on the nature of line-width variation. In the first step 51, $D_{image}$ is measured by conventional methods and $E_{max}$ is measured and stored. The next step 52 is a decision step to decide whether to proceed with preparing the wafer or job. If the result of this decision is "no", then the cycle ends. If the answer is "yes", then $E'_{max}$ is measured in step 53. An adjustment of dosage to $$D_{image} * \frac{E'_{max}}{E_{max}},$$

is made in step 54, and the product chips are exposed with the new dosage in step 55. The process cycles back to the decision step 52.

Figure 6:
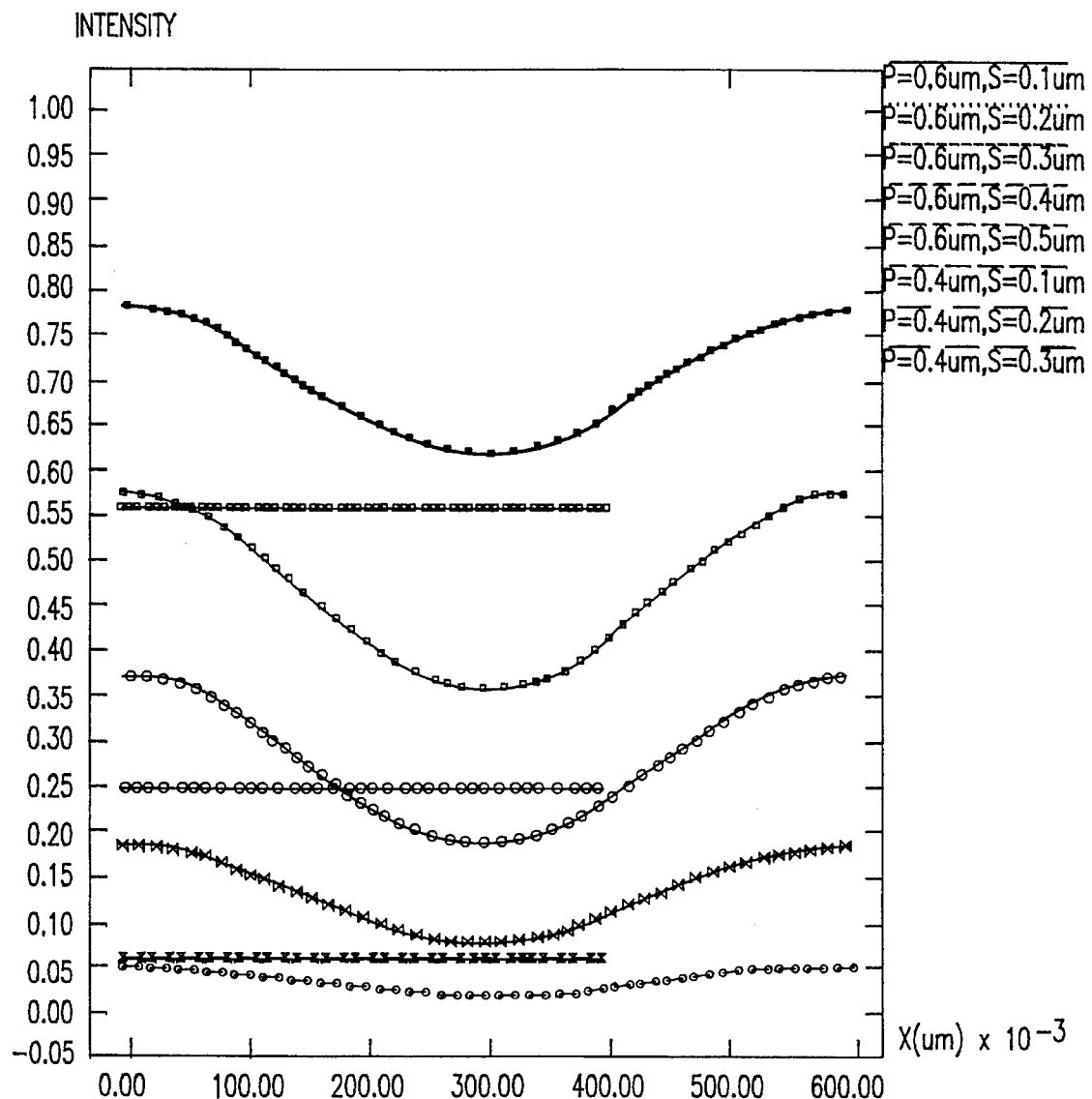
FIG. 6 is a graph showing simulated aerial images formed by grating of small periods and narrow Cr lines.

For gratings of small periods compared to wavelength, such as 2 μm to λ=633 nm, yield a small number of diffraction orders and large signal intensity, the opaque regions can be formed by a narrow Cr line (e.g. 0.4 μm by a 0.48 NA i-line lens) below the resolution limit of the projection system so that the light intensity under the Cr line is not zero. For gratings of moderate to large periods compared to wavelength, such as 16 μm to λ=633 nm as used by the ASML alignment system, either the opaque line can be made by materials (e.g., the ones used for attenuated phase shifting mask) of partial transmissivity, or the Cr line can be made up of many fine Cr lines the below resolution limit. The latter is illustrated in FIG. 6, in which simulated aerial images of gratings with period=0.6 μm, 0.4 μm (wafer scale) and Cr lines of various widths are calculated. Thus, the partial transmissivity can be designed to suit resists of different bleaching characteristics. The smallest Cr width and its increment is 0.1 μm (0.5 μm on a 5× mask), which is within the capacity of modem E-beam writing equipment. Note that the ASML alignment system detects the first order diffraction efficiency from a grating on the wafer. Any optical system that detects non-zero diffraction efficiencies from a grating can be used in the practice of the invention.

If the grating is of a large period, then instead of exposing a series of LIM marks the same mark should be reused to save real estate. This can be achieved since the accuracy of a modem stepper stage is below 10 nm, which is much smaller than the period. Thus, alignment accuracy of the stage moving back to the same mark is not a problem.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of determining the optimal exposure dosage required for semiconductor photolithography comprising the steps of;

providing a photoresist to be bleached;

constructing mask consisting of transparent and semitransparent regions, said semitransparent regions being made up of multiple opaque lines;

placing said mask over the photoresist;

exposing said photoresist to light through said mask;

measuring the exposure of said photoresist to energy until said photoresist is fully bleached; and calculating an optimal exposure dosage required from measurements of exposure of said photoresist.

2. A method of determining the optimal exposure dosage required for semiconductor photolithography as in claim 1 further comprising building each said multiple opaque line from many Cr lines which are finer than optical resolution limits of a resist exposure system.

3. A method of exposing product chips to optimal exposure dosage of light comprising the steps of:

providing a photoresist to be bleached;

constructing a mask consisting of transparent and semitransparent regions, said semitransparent regions being made up of multiple opaque lines;

placing said mask over the photoresist;

exposing said photoresist to light through said mask;

measuring the exposure of said photoresist to energy until said photoresist is fully bleached;

calculating an optimal exposure dosage required from measurements of exposure of said photoresist; and exposing product chips to said optimal exposure dosage.

4. A method of exposing product chips to optimal exposure dosage of light as in claim 3 further comprising building each said multiple opaque line from many Cr lines which are finer than optical resolution limits of a resist exposure system.

* * * * *